(12) United States Patent
Takada et al.

(10) Patent No.: US 6,504,452 B2
(45) Date of Patent: Jan. 7, 2003

(54) LOW-PASS FILTER AND MOBILE COMMUNICATION DEVICE USING THE SAME

(75) Inventors: Yoshiki Takada, Okayama-ken (JP); Koji Furutani, Okayama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/836,130

(22) Filed: Apr. 17, 2001

(65) Prior Publication Data
US 2002/0030562 A1 Mar. 14, 2002

(30) Foreign Application Priority Data

May 22, 2000 (JP) ......................... 2000-150431

(51) Int. Cl.[7] .................................. H03H 7/01
(52) U.S. Cl. ......................... 333/185; 333/175
(58) Field of Search ................. 333/167, 175, 333/185, 204, 134

(56) References Cited

U.S. PATENT DOCUMENTS

| 5,668,511 A | 9/1997 | Furutani et al. ............ 333/204 |
| 5,777,533 A | * 7/1998 | Kato et al. .................. 333/175 |
| 6,061,227 A | * 5/2000 | Nogi ........................... 333/185 |
| 6,097,268 A | * 8/2000 | Watanabe et al. ........... 333/132 |

FOREIGN PATENT DOCUMENTS

| EP | 0 844 733 A2 | 5/1998 | |
| EP | 0 926 933 A1 | 6/1999 | |
| JP | 07263908 A | * 10/1995 | |
| JP | 07-336176 | 12/1995 | |
| JP | 11136066 A | * 5/1999 | .......... H01F/27/00 |
| JP | 11225034 A | * 8/1999 | ............. H01P/1/20 |
| WO | WO 97/36307 | 10/1997 | |
| WO | WO 99/19982 | 4/1999 | |

* cited by examiner

Primary Examiner—Seungsook Ham
(74) Attorney, Agent, or Firm—Keating & Bennett, LLP

(57) ABSTRACT

A low-pass filter is defined by a laminate containing an inductor electrode, a plurality of capacitor electrodes, and at least two ground electrodes. The laminate is defined by a plurality of laminated dielectric layers. The low-pass filter includes a grounded capacitor defined by a capacitor electrode and the at least two ground electrodes, the capacitor being located between the ground electrodes, and an ungrounded capacitor including a capacitor electrode which is not located between the ground electrodes.

17 Claims, 4 Drawing Sheets

FIG. 5
PRIOR ART
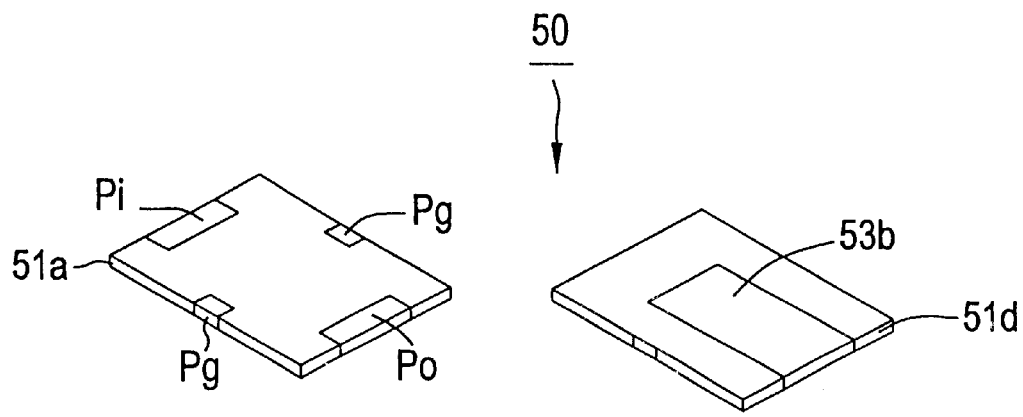
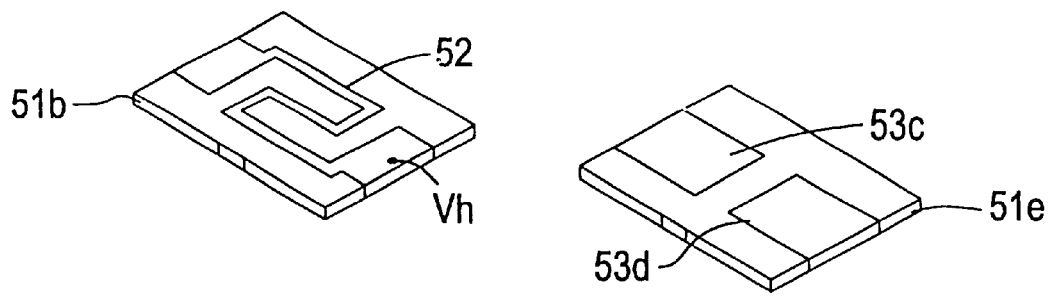
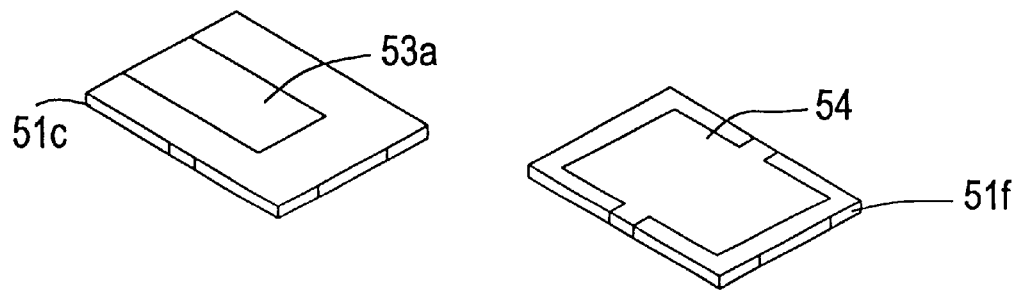

LOW-PASS FILTER AND MOBILE COMMUNICATION DEVICE USING THE SAME

BACKGROUND OF THE INVENTION

1. Field of the Invention

The present invention relates to a low-pass filter and a mobile communication device using the same, and more particularly, to a low-pass filter used in a GHz band and a mobile communication device including the same.

2. Description of the Related Art

As known in the art, a low-pass filter operates to pass signals having a frequency lower than a desired frequency to remove a desired level, or higher, of harmonic signals, and includes an inductor and a capacitor.

FIG. 4 is a circuit diagram of a typical low-pass filter. The low-pass filter includes an LC parallel resonance circuit having an inductor L and an ungrounded capacitor C1 connected between an input terminal Pi and an output terminal Po. The low-pass filter further includes grounded capacitors C2 and C3 connected between the ends of the LC parallel resonance circuit and ground, respectively.

FIG. 5 is an exploded perspective view showing a conventional low-pass filter 50. The low-pass filter 50 includes a laminate defined by six dielectric layers 51a to 51f, as disclosed in Japanese Unexamined Patent Application Publication No. 7-336176. The dielectric layer 51a is a protective layer, the dielectric layer 51b has an inductor electrode 52 provided thereon, and the dielectric layers 51c and 51d have capacitor electrodes 53a and 53b provided thereon, respectively. The dielectric layer 51e has capacitor electrodes 53c and 53d provided thereon, and the dielectric layer 51f has a ground electrode 54 provided thereon.

One end of the inductor electrode 52 extends to one shorter side of the dielectric layer 51b and connects to the input terminal Pi, and the other end of the inductor electrode 52 extends to the other shorter side of the dielectric layer 51b and connects to the output terminal Po. One end of the capacitor electrode 53a extends to one shorter side of the dielectric layer 51c, and one end of the capacitor electrode 53c extends to one shorter side of the dielectric layer 51e to connect to the input terminal Pi. One end of the capacitor electrode 53b extends to one shorter side of the dielectric layer 51d, and one end of the capacitor electrode 53d extends to the other shorter side of the dielectric layer 51e to connect to the output terminal Po. Portions of the ground electrode 54 extend to longer opposing sides of the dielectric layer 51f to connect to the ground terminals Pg.

The inductor electrode 52 defines the inductor L, and the inductance of the inductor L depends upon the length of the inductor electrode 52. The capacitor electrodes 53a and 53b define the ungrounded capacitor C1, and the capacitance of the ungrounded capacitor C1 depends upon the spacing between the capacitor electrodes 53a and 53b, the overlapping area thereof, and the permittivity of the dielectric layer 51c. The capacitor electrodes 53c and 53d, and the ground electrode 54 define the grounded capacitors C2 and C3, and the capacitances of the grounded capacitors C2 and C3 depend upon the spacing between the capacitor electrode 53c and the ground electrode 54, the spacing between the capacitor electrodes 53d and the ground electrode 54, the overlapping area of each of the capacitor electrodes 53c and 53d with the ground electrode 54, and the permittivity of the dielectric layer 51e.

However, the conventional low-pass filter encounters a problem. Specifically, in such a low-pass filter, a capacitor electrode that defines an ungrounded capacitor overlaps, via a dielectric layer, a capacitor electrode and a ground electrode that together define a grounded capacitor. This arrangement produces a capacitance between the capacitor electrode defining the ungrounded capacitor and the capacitor electrode defining the grounded capacitor, and also produces a capacitance between the capacitor defining the ungrounded capacitor and the ground electrode defining the grounded capacitor. Hence, the capacitances of the ungrounded capacitor and the grounded capacitor are not independently controlled, making it difficult to accurately control the pass band of the low-pass filter.

SUMMARY OF THE INVENTION

To overcome the above-described problems with the prior art, preferred embodiments of the present invention provide a low-pass filter which facilitates control of the pass band with improved insertion-loss and attenuation characteristics, and a mobile communication device using the same.

A low-pass filter includes a laminate containing an inductor electrode, a plurality of capacitor electrodes, and at least two ground electrodes. The laminate is defined by laminating a plurality of dielectric layers. The low-pass filter includes a grounded capacitor defined by a capacitor electrode and at least two ground electrodes, the capacitor electrode being located between the at least two ground electrodes, and an ungrounded capacitor including a capacitor electrode which is not located between the ground electrodes.

The inductor electrode is provided between the capacitor electrode, which defines the ungrounded capacitor, and the principal plane of the laminate.

According to another preferred embodiment of the present invention, a low-pass filter includes an LC parallel resonance circuit having an inductor and a capacitor connected in parallel, and at least one grounded capacitor provided between at least one end of the LC parallel resonance circuit and ground. The inductor of the LC parallel resonance circuit is defined by an inductor electrode incorporated in a laminate, the laminate being defined by laminating a plurality of dielectric layers. The capacitor of the LC parallel resonance circuit is defined by a first capacitor electrode and a second capacitor electrode. The first and second capacitor electrodes being incorporated in the laminate. The grounded capacitor is defined by a first ground electrode, a second ground electrode, and a capacitor electrode provided between the first and second ground electrodes within the laminate.

Preferably, the at least one grounded capacitor includes first and second grounded capacitors provided at the ends of the LC parallel resonance circuit. The first grounded capacitor is preferably defined by the first ground electrode, the second ground electrode, and a third capacitor electrode provided between the first and second ground electrodes. The second ground capacitor is preferably defined by the first ground electrode, the second ground electrode, and a fourth capacitor electrode provided between the first and second ground electrodes.

The second capacitor electrode may partially overlap the first ground electrode via a dielectric layer, and the first grounded capacitor may also be defined by the second capacitor electrode and the first ground electrode.

The first capacitor electrode may have a portion that overlaps with the first ground electrode without interposition of the second capacitor electrode, and the second grounded capacitor may also be defined by the overlapping portion of the first capacitor electrode and the first ground electrode.

Preferably, the inductor electrode is provided on a dielectric layer opposite to the dielectric layers on which the grounded capacitor is provided, with respect to the dielectric layers on which the first and second capacitor electrodes are provided.

The inductor electrode, the first capacitor electrode, the second capacitor electrode, the first ground electrode, and the second ground electrode may be provided on different dielectric layers.

Accordingly, a low-pass filter according to preferred embodiments of the present invention allows a grounded capacitor to be defined by two ground electrodes and a capacitor electrode held between the two ground electrodes. Therefore, the capacitances of an ungrounded capacitor (i.e., a capacitor of an LC parallel resonance circuit) and the grounded capacitor are independently controlled.

In another preferred embodiment of the present invention, a mobile communication device including a low-pass filter in accordance with other preferred embodiments of the present invention is provided. The mobile communication device including a low-pass filter which facilitates control of the pass band provides improved performance for transmission and reception.

Other features, characteristics, elements and advantages of the present invention will become more apparent from the following detailed description of preferred embodiments thereof with reference to the attached drawings.

BRIEF DESCRIPTION OF THE DRAWINGS

FIG. 5 is an exploded perspective view of a conventional low-pass filter.

DETAILED DESCRIPTION OF PREFERRED EMBODIMENTS

Figure 1:
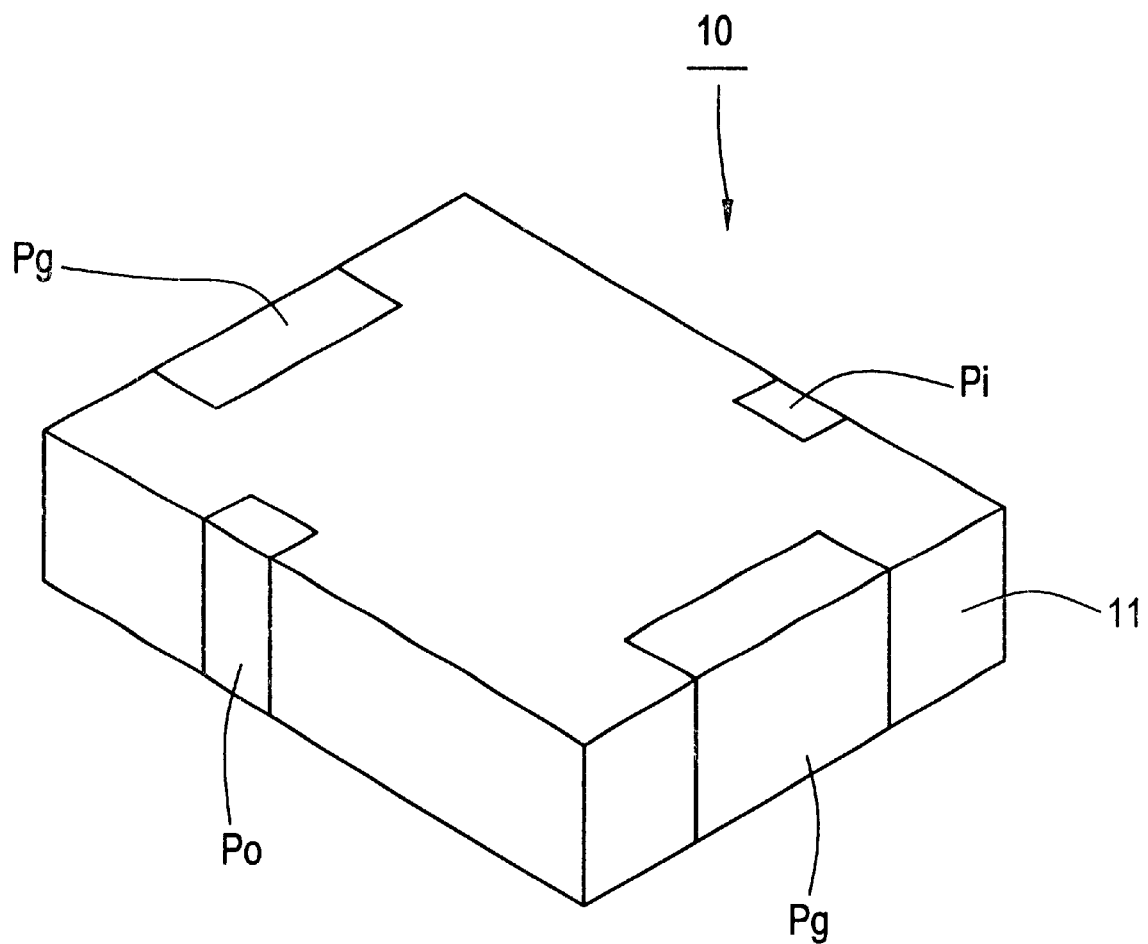
FIG. 1 is a perspective view of a low-pass filter according to a preferred embodiment of the present invention.
Figure 2:
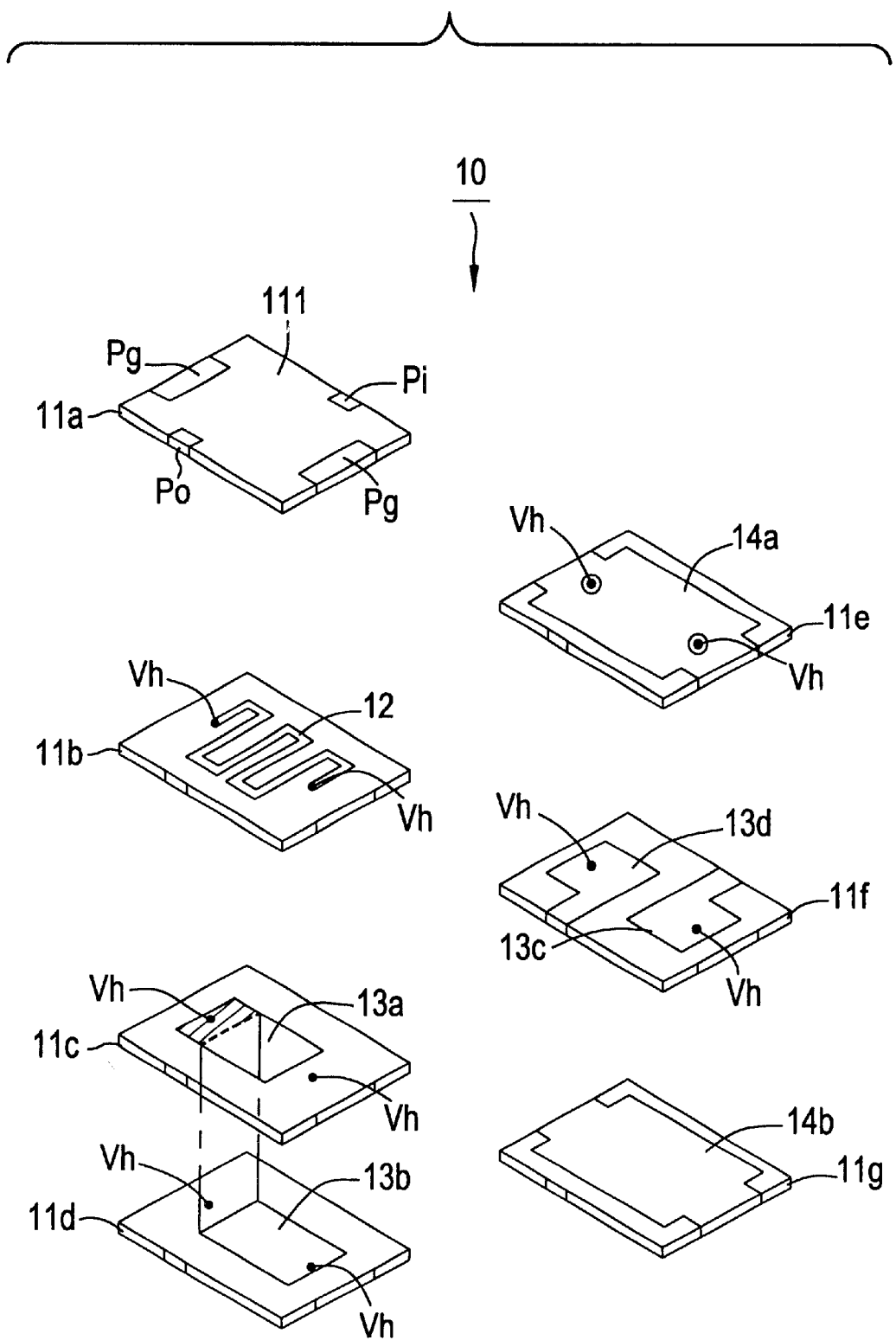
FIG. 2 is an exploded perspective view of the low-pass filte shown in FIG. 1.

FIGS. 1 and 2 are a perspective view and an exploded perspective view, respectively, showing a low-pass filter 10 according to a preferred embodiment of the present invention.

The low-pass filter 10 includes a laminate 11 defined by sequentially laminated dielectric layers 11a to 11g. The dielectric layer 11a is a protective layer, the dielectric layer 11b has an inductor electrode 12 provided thereon, and the dielectric layers 11c and 11d have capacitor electrodes 13a and 13b provided thereon, respectively. The dielectric layer 11e has a ground electrode 14a provided thereon, the dielectric layer 11f has capacitor electrodes 13c and 13d provided thereon, and the dielectric layer 11g has a ground electrode 14b provided thereon.

A portion of the capacitor electrode 13c extends to one of the longer sides of the dielectric layer 11f and connects to an input terminal Pi. A portion of the capacitor electrode 13d extends to the other of the longer sides of the dielectric layer 11f and connects to an output terminal Po.

Portions of the ground electrode 14a extend to shorter opposing sides of the dielectric layer 11e, and portions of the ground electrode 14b also extend to shorter opposing sides of the dielectric layer 11g to connect to ground terminals Pg.

One end of the inductor electrode 12 is connected to the capacitor electrodes 13a and 13d through a via-hole electrode Vh. The other end of the inductor electrode 12 is connected to the capacitor electrodes 13b and 13c through a via-hole electrode Vh. The via-hole electrodes Vh extend through the dielectric layers 11b to 11e.

Figure 4:
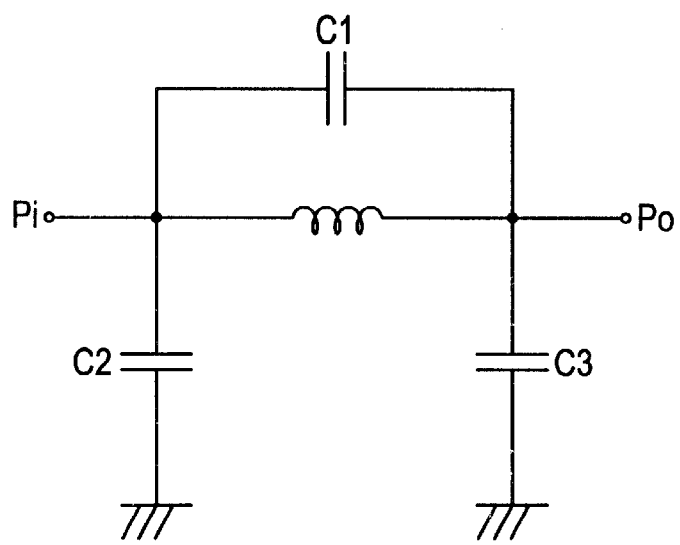
FIG. 4 is a circuit diagram of a typical low-pass filter.

These electrodes are used to define a low-pass filter, as shown in FIG. 4, including an LC parallel resonance circuit having an inductor L and an ungrounded capacitor C1 connected in parallel, and grounded capacitors C2 and C3 connected to the ends of the LC parallel resonance circuit.

More specifically, the inductor L is defined by the inductor electrode 12. That is, the inductance of the inductor L depends upon the length of inductor electrode 12. The ungrounded capacitor C1 (i.e., the capacitor of the LC parallel resonance circuit) is defined by the first capacitor electrode 13a and the second capacitor electrode 13b. That is, the capacitance of the ungrounded capacitor C1 depends upon the spacing between the first and second capacitor electrodes 13a and 13b, the overlapping area thereof, and the thickness and permittivity of the dielectric layer 11c.

The first grounded capacitor C2 is defined by the third capacitor electrode 13c, the first ground electrode 14a, and the second ground electrode 14b. It is also defined by the second capacitor electrode 13b and the first ground electrode 14a. That is, the capacitance of the first grounded capacitor C2 depends upon the spacing between the third capacitor electrodes 13c and the first ground electrode 14a, the spacing between the third capacitor electrodes 13c and the second ground electrode 14b, the overlapping area of each of the first ground electrode 14a and the second ground electrode 14b with the third capacitor electrodes 13c, and the thickness and permittivity of the dielectric layers 11e and 11f. In addition, this capacitance depends upon the spacing between the second capacitor electrodes 13b and the first ground electrode 14a, the overlapping area thereof, and the thickness and permittivity of the dielectric layers 11d to 11f.

The second grounded capacitor C3 is defined by the fourth capacitor electrode 13d, the first ground electrode 14a, and the second ground electrode 14b. It is also defined by the first capacitor electrode 13a and the first ground electrode 14a. That is, the capacitance of the second grounded capacitor C3 depends upon the spacing between the fourth capacitor electrode 13d and the first ground electrode 14a, the spacing between the fourth capacitor electrode 13d and the second ground electrode 14b, the overlapping area of each of the first ground electrode 14a and the second ground electrode 14b with the fourth capacitor electrode 13d, and the thickness and permittivity of the dielectric layers 11e and 11f. In addition, this capacitance depends upon the spacing between the first capacitor electrode 13a and the first ground electrode 14a, the overlapping area (the area of a portion (the shaded portion in FIG. 2) of the first capacitor electrode 13a that overlaps with the first ground electrode 14a without interposition of the second capacitor electrode 13b), and the thickness and permittivity of the dielectric layers 11c to 11f.

The laminated construction, therefore, provides the inductor electrode 12 between the capacitor electrodes 13a and 13b, which together define the ungrounded capacitor C1, and the principle plane 111 of the laminate 11.

The capacitance of the ungrounded capacitor C1 (FIG. 1) is controlled by changing the area of a portion (the unshaded portion in FIG. 2) of the capacitor electrode 13a that overlaps with the capacitor electrode 13b.

Likewise, the capacitance of the grounded capacitors C2 and C3 (FIG. 1) is controlled by changing the area of the capacitor electrodes 13c and 13d.

The foregoing low-pass filter in the illustrated preferred embodiment includes an ungrounded capacitor defined by two ground electrodes and a capacitor electrode held between the two ground electrodes, and a grounded capacitor defined by another capacitor electrode which is not located between ground electrodes. This enables the capacitances of the ungrounded capacitor and the grounded capacitor to be independently controlled, realizing a low-pass filter which facilitates control of the pass band.

Furthermore, a grounded capacitor is defined by at least ground electrodes and a capacitor electrode which is located between the ground electrodes, whereby the area of the capacitor electrode located in the grounded capacitor is halved. This makes it possible to realize a compact low-pass filter.

Alternatively, a grounded capacitor may be defined by a capacitor electrode which is not located between ground electrodes, and a ground electrode, thus reducing the area of the capacitor electrode within the grounded capacitor. This arrangement also produces a compact low-pass filter.

Since an inductor electrode is located between a capacitor electrode, which defines an ungrounded capacitor, and the principal plane of the laminate, impedance of the inductor electrode is greatly increased to significantly improve the Q factor of the low-pass filter. This provides a low-pass filter with greatly improved insertion-loss and attenuation characteristics.

Figure 3:
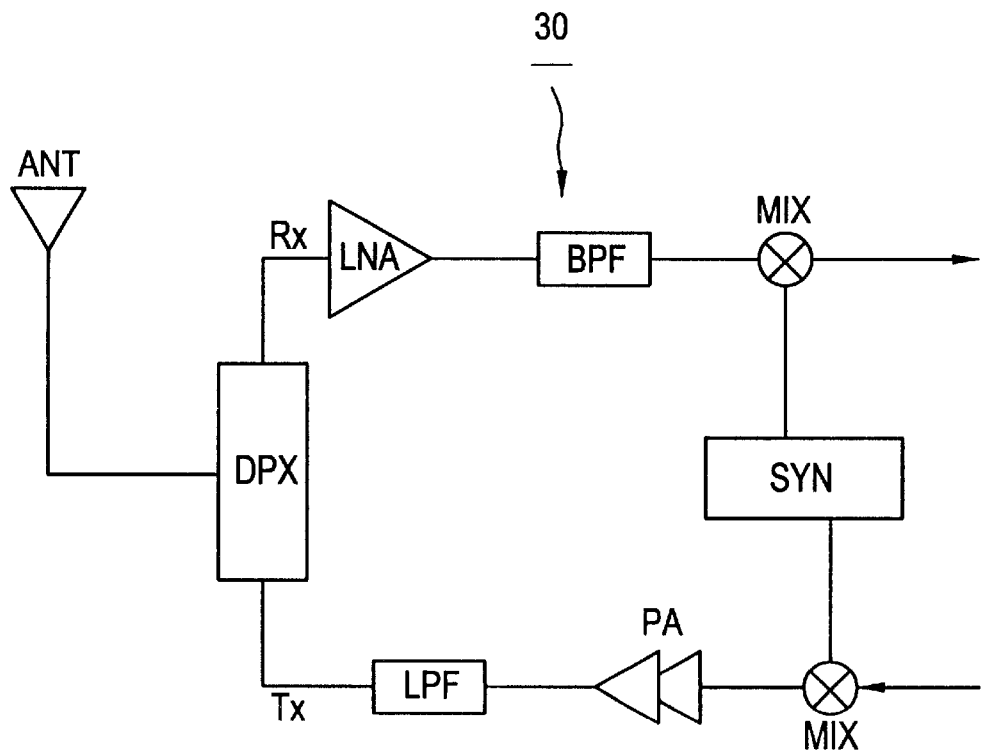
FIG. 3 is a block diagram of an RF unit of a cellular telephone device as an example of a mobile communication device according to preferred embodiments of the present invention

FIG. 3 is a block diagram showing a radio frequency (RF) unit 30 of a cellular telephone device as an example of a mobile communication device according to a preferred embodiment of the present invention. The RF unit 30 includes an antenna ANT, a duplexer DPX, a receiver circuit Rx, and a transmitter circuit Tx.

The receiver circuit Rx includes a low-noise amplifier LNA, a band-pass filter BPF, and a mixer MIX. The transmitter circuit Tx includes a low-pass filter LPF, a high-power amplifier PA, and a mixer MIX. A synthesizer SYN for generating a local oscillation signal is connected to an input of either of the mixer MIX of the receiver circuit Rx or the mixer MIX of the transmitter circuit Tx.

The low-pass filter 10 shown in FIG. 1 is used as the low-pass filter LPF in the RF unit 30.

A cellular telephone device according to a preferred embodiment of the present invention includes a low-pass filter which facilitates control of the pass band with an improved insertion-loss characteristic. This produces a cellular telephone device which provides greatly improved transmission and reception performance.

While a low-pass filter of the illustrated preferred embodiment is described as being a first-order low-pass filter, second- or higher-order low-pass filters having a plurality of low-pass filters connected in multiple stages have the same advantages.

A low-pass filter may be combined with a high-frequency switch, a duplexer, a diplexer, or other suitable component.

A low-pass filter in the illustrated preferred embodiments is described with respect in which an inductor electrode and capacitor electrodes that define an ungrounded capacitor are disposed above an upper ground electrode that defines a grounded capacitor. However, disposing these components beneath a lower ground electrode that defines a grounded capacitor would have the same advantages.

While the invention has been particularly shown and described with reference to preferred embodiments thereof, it will be understood by those skilled in the art that the foregoing and other changes in form and details can be made without departing from the spirit and scope of the invention.

What is claimed is:

1. A low-pass filter comprising:
    a laminate having an inductor electrode, a plurality of capacitor electrodes, and at least two ground electrodes, said laminate being defined by laminating a plurality of dielectric layers, and said laminate having an upper surface defining a principal plane of the laminate;
    a grounded capacitor defined by a capacitor electrode and said at least two ground electrodes, said grounded capacitor being located between said at least two ground electrodes; and
    an ungrounded capacitor including a capacitor electrode not located between said at least two ground electrodes; wherein
        the inductor electrode is located between the capacitor electrode, which defines the ungrounded capacitor, and the principal plane of the laminate.

2. A low-pass filter according to claim 1, wherein a portion of one of the plurality of capacitor electrodes extends to one longer side of one of the plurality of dielectric layers and connects to an input terminal, and a portion of another of the plurality of capacitor electrodes extends to the other longer side of said one of the plurality of dielectric layers and connects to an output terminal.

3. A low-pass filter according to claim 1, wherein one end of the inductor electrode is connected to two of the plurality of capacitor electrodes through a via-hole electrode, and the other end of the inductor electrode is connected to two of the plurality of capacitor electrodes through another via-hole electrode.

4. A low-pass filter according to claim 3, wherein the via-hole electrodes extend through at least two of the plurality of dielectric layers.

5. A low-pass filter according to claim 1, wherein portions of one of said at least two ground electrodes extend to shorter opposing sides of one of the plurality of dielectric layers, and portions of another of said at least two ground electrodes also extends to shorter opposing sides of said one of the plurality of dielectric layers to connect to ground terminals.

6. A mobile communication device including a low-pass filter according to claim 1.

7. A low-pass filter comprising:
    an LC parallel resonance circuit having an inductor and a capacitor connected in parallel; and
    at least one grounded capacitor provided between at least one end of said LC parallel resonance circuit and a ground;
    wherein the inductor of said LC parallel resonance circuit is defined by an inductor electrode incorporated in a laminate, the laminate being defined by a plurality of laminated dielectric layers and having an upper surface defining a principal plane of the laminate;
    the capacitor of said LC parallel resonance circuit is defined by a first capacitor electrode and a second capacitor electrode, the first and second capacitor electrodes being incorporated in the laminate; and
    the at least one grounded capacitor is defined by at least three electrodes comprising a first ground electrode, a second ground electrode and a third capacitor electrode, said third capacitor electrode being provided between the first and second ground electrodes within the laminate; wherein the inductor electrode is located between the first and second capacitor electrodes, which define the capacitor of the LC parallel resonance circuit, and the principal plane of the laminate.

8. A low-pass filter according to claim 7, wherein said at least one grounded capacitor comprises first and second grounded capacitors provided at the ends of said LC parallel resonance circuit, the first grounded capacitor is defined by a fourth capacitor electrode and the first and second ground electrodes, said fourth capacitor electrode being provided between the first and second ground electrodes, and the second grounded capacitor is defined by a fifth capacitor electrode and the first and second ground electrodes, said fifth capacitor electrode being provided between the first and second ground electrodes.

9. A low-pass filter according to claim 8, wherein the second capacitor electrode partially overlaps the first ground electrode via a dielectric layer, and the first grounded capacitor is further defined by the second capacitor electrode and the first ground electrode.

10. A low-pass filter according to claim 8, wherein the first capacitor electrode includes a portion that overlaps with the first ground electrode without interposition of the second capacitor electrode, and the second grounded capacitor is further defined by the overlapping portion of the first capacitor electrode and the first ground electrode.

11. A low-pass filter according to claim 7, wherein the inductor electrode is provided on a dielectric layer opposite to the dielectric layers on which the grounded capacitor is provided, with respect to the dielectric layers on which the first and second capacitor electrodes are provided.

12. A low-pass filter according to claim 7, wherein the inductor electrode, the first capacitor electrode, the second capacitor electrode, the first ground electrode, and the second ground electrode are located on different dielectric layers.

13. A low-pass filter according to claim 7, wherein a portion of the first capacitor electrode extends to one longer side of one of the plurality of laminated dielectric layers and connects to an input terminal, and a portion the second capacitor electrode extends to the other longer side of said one of the plurality of laminated dielectric layers and connects to an output terminal.

14. A low-pass filter according to claim 7, wherein one end of the inductor electrode is connected to the first and second capacitor electrodes through a via-hole electrode, and the other end of the inductor electrode is connected to the first and second capacitor electrodes through another via-hole electrode.

15. A low-pass filter according to claim 14, wherein the via-hole electrodes extend through at least two of the plurality of laminated dielectric layers.

16. A low-pass filter according to claim 7, wherein portions of one of said first and second ground electrodes extends to shorter opposing sides of one of the plurality of laminated dielectric layers, and portions of the other of said first and second ground electrodes also extends to shorter opposing sides of said one of the plurality of laminated dielectric layers to connect to ground terminals.

17. A mobile communication device including a low-pass filter according to claim 7.

* * * * *